United States Patent
Wakasugi

(10) Patent No.: US 10,097,175 B2
(45) Date of Patent: Oct. 9, 2018

(54) SEMICONDUCTOR DEVICE AND DC-DC CONVERTER

(71) Applicant: Kabushiki Kaisha Toshiba, Minato-ku, Tokyo (JP)

(72) Inventor: Kenichi Wakasugi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/701,193

(22) Filed: Sep. 11, 2017

(65) Prior Publication Data

US 2018/0183430 A1    Jun. 28, 2018

(30) Foreign Application Priority Data

Dec. 28, 2016 (JP) .................................. 2016-255616

(51) Int. Cl.
| | | |
|---|---|---|
| *H02M 3/156* | (2006.01) | |
| *H02M 3/158* | (2006.01) | |
| *H03K 17/16* | (2006.01) | |
| *H02M 3/135* | (2006.01) | |

(52) U.S. Cl.
CPC .......... *H03K 17/161* (2013.01); *H02M 3/135* (2013.01)

(58) Field of Classification Search
CPC .............................. H03K 17/161; H03M 3/135
See application file for complete search history.

(56) References Cited

U.S. PATENT DOCUMENTS

| | | | | |
|---|---|---|---|---|
| 5,731,731 A * | 3/1998 | Wilcox | .................. | H02M 3/158 327/170 |
| 5,905,370 A * | 5/1999 | Bryson | .................. | H02M 3/157 323/283 |
| 6,215,288 B1 * | 4/2001 | Ramsey | .............. | H02M 3/1588 323/224 |
| 7,728,573 B2 * | 6/2010 | Capilla | ............... | H02M 3/1588 323/271 |
| 7,821,236 B2 * | 10/2010 | Hasegawa | ........... | H02M 3/1588 323/222 |
| 7,916,503 B2 * | 3/2011 | Hasegawa | ............. | H02M 3/156 363/16 |
| 8,259,421 B2 * | 9/2012 | Nakahashi | ............... | H02M 1/32 323/276 |
| 8,742,745 B2 * | 6/2014 | Huang | .................. | H02M 3/156 323/285 |

(Continued)

FOREIGN PATENT DOCUMENTS

| | | |
|---|---|---|
| JP | 2011-087405 A | 4/2011 |
| JP | 2011-199973 A | 10/2011 |

(Continued)

*Primary Examiner* — Kenneth B Wells
(74) *Attorney, Agent, or Firm* — White & Case LLP

(57) ABSTRACT

According to an embodiment, a semiconductor device includes: a first modulation circuit configured to generate a reference signal based on a first clock signal; a second modulation circuit configured to generate a feedback signal with a phase negative relative to a phase of the reference signal based on a second clock signal with a phase negative relative to a phase of the first clock signal; a comparator configured to compare the reference signal with the feedback signal to determine duty and generate a comparator signal; and a driver configured to output a drive signal.

9 Claims, 4 Drawing Sheets

(56) References Cited

U.S. PATENT DOCUMENTS

| | | | | |
|---|---|---|---|---|
| 8,872,496 | B2* | 10/2014 | Miyamae | G05F 1/46 |
| | | | | 323/285 |
| 9,030,184 | B2* | 5/2015 | Huang | H02M 3/156 |
| | | | | 323/285 |
| 9,077,242 | B2* | 7/2015 | Causse | H02M 3/158 |
| 9,300,211 | B2* | 3/2016 | Yanagida | H02M 3/1582 |
| 9,337,729 | B2* | 5/2016 | Kokatsu | H02M 3/156 |

FOREIGN PATENT DOCUMENTS

| | | |
|---|---|---|
| JP | 2015-053833 A | 3/2015 |
| JP | 2017-055578 A | 3/2017 |
| JP | 6145038 B2 | 6/2017 |

\* cited by examiner

SEMICONDUCTOR DEVICE AND DC-DC CONVERTER

CROSS-REFERENCE TO RELATED APPLICATION

This application is based upon and claims the benefit of priority from the prior Japanese Patent Application No. 2016-255616 filed in Japan on Dec. 28, 2016; the entire contents of which are incorporated herein by reference.

FIELD

An embodiment described herein relates generally to a semiconductor device and a DC-DC converter.

BACKGROUND

Conventionally, there has been a DC-DC converter that compares a reference signal of a triangular wave with a feedback signal obtained by feeding back output voltage to determine duty, generates a PWM signal based on the determined duty, generates a drive signal by switching by a driver according to the PWM signal and outputs predetermined output voltage that is based on the drive signal.

In the DC-DC converter, noise is generated by switching by the driver, and the noise is propagated to other circuits via a transmission path such as power supply wiring. For example, the noise may be superimposed on the reference signal and the feedback signal. When mutually different noises are superimposed on the reference signal and the feedback signal, respectively, because of an impedance difference between transmission paths, jitter of a comparator signal increases, and operation of the DC-DC converter becomes unstable.

DETAILED DESCRIPTION

A semiconductor device of an embodiment has a first modulation circuit, a second modulation circuit, a comparator and a driver. The first modulation circuit modulates reference voltage based on a first clock signal to generate a reference signal, and a second modulation circuit modulates feedback voltage that is based on output voltage, based on a second clock signal with a phase negative relative to a phase of the first clock signal to generate a feedback signal with a phase negative relative to a phase of the reference signal. The comparator compares the reference signal with the feedback signal to determine duty and generates a comparator signal having the duty, and the driver outputs a drive signal based on the comparator signal.

Embodiment

An embodiment will be described with reference to drawings.

Configuration

Figure 1:
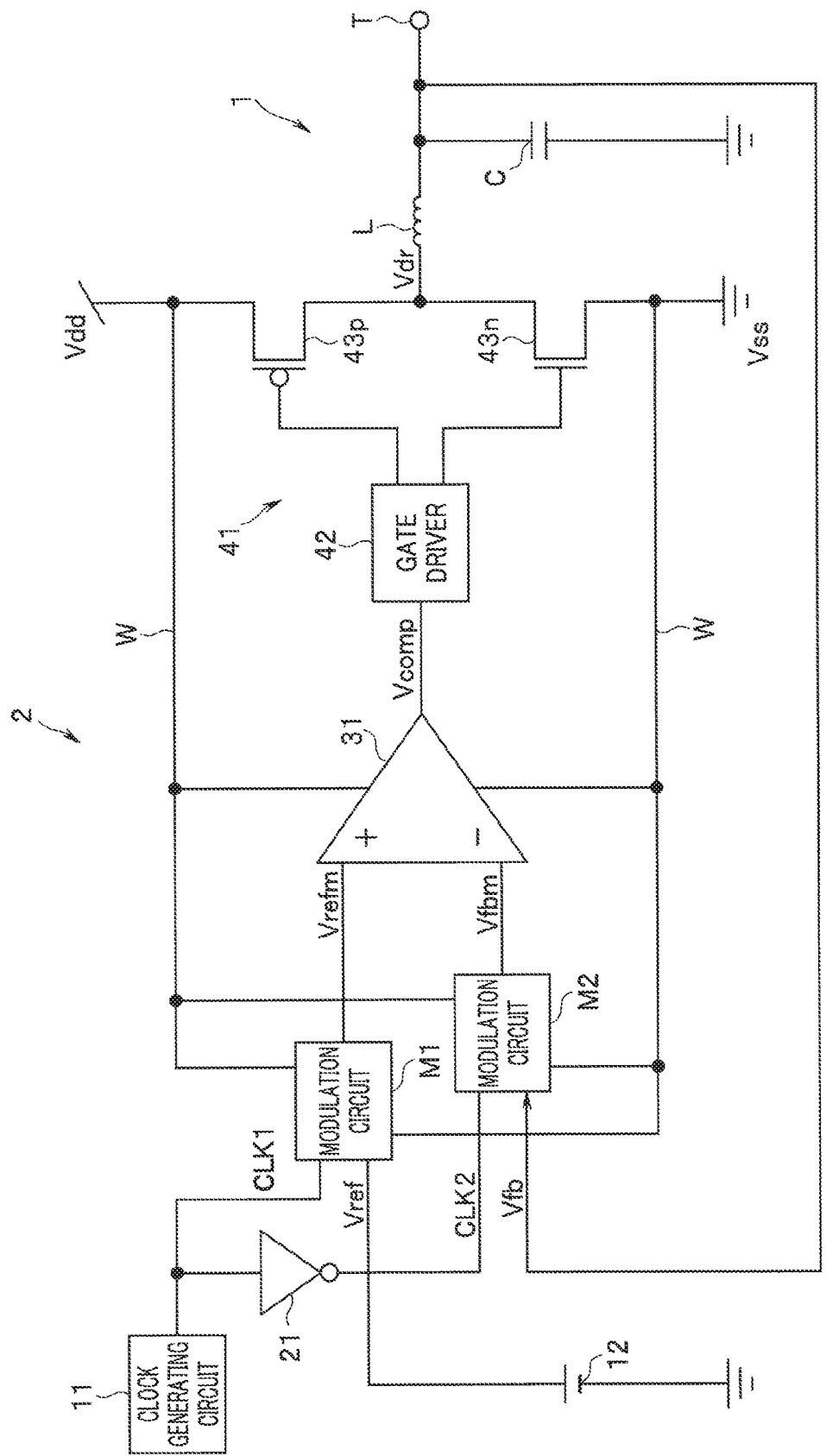
FIG. 1 is a circuit diagram showing an example of a DC-DC converter according to an embodiment.

FIG. 1 is a circuit diagram showing an example of a DC-DC converter 1 according to the embodiment.

The DC-DC converter 1 has a clock generating circuit 11, a power supply circuit 12, an inverter circuit 21, a modulation circuit M1 which is a first modulation circuit, a modulation circuit M2 which is a second modulation circuit, a comparator 31, a gate driver 42, FETs 43$p$ and 43$n$, an inductor L, a capacitor C and an output terminal T. An external loading apparatus not shown is connected to the output terminal T.

The clock generating circuit 11, the power supply circuit 12, the inverter circuit 21, the modulation circuits M1 and M2, the comparator 31, the gate driver 42 and the FETs 43$p$ and 43$n$ constitute a semiconductor device 2.

The modulation circuits M1 and M2, the comparator 31 and the FETs 43$p$ and 43$n$ are connected to power supply voltage Vdd and ground voltage Vss via power supply wiring W.

The clock generating circuit 11 is connected to the modulation circuit M1 and the inverter circuit 21. The clock generating circuit 11 generates a clock signal CLK1, which is a first clock signal, and outputs the clock signal CLK1 to the modulation circuit M1 and the inverter circuit 21.

The clock signal CLK1 has a predetermined frequency and is configured with such a rectangular wave that an H level and an L level are alternately repeated every predetermined period.

One end of the power supply circuit 12 is connected to fixed potential, and the other end is connected to the modulation circuit M1. The power supply circuit 12 generates reference voltage Vref and outputs the reference voltage Vref to the modulation circuit M1.

The modulation circuit M1 is connected to a non-inverting input terminal of the comparator 31. The modulation circuit M1 modulates the reference voltage Vref based on the clock signal CLK1 to generate a reference signal Vrefm, and outputs the reference signal Vrefm to the comparator 31. For example, the modulation circuit M1 is configured with an integration circuit.

The reference signal Vrefm is configured with a triangular wave the signal level of which decreases with passage of time when the clock signal CLK1 is at the H level and increases with passage of time when the clock signal CLK1 is at the L level.

The inverter circuit 21 is connected to the modulation circuit M2. The inverter circuit 21 inverts the level of the clock signal CLK1 inputted from the clock generating circuit 11 to generate a clock signal CLK2, which is a second clock signal, and outputs the clock signal CLK2 to the modulation circuit M2.

The clock signal CLK2 is a signal with a phase negative relative to a phase of the clock signal CLK1. That is, when the clock signal CLK1 is at the H level, the clock signal CLK2 is at the L level. Further, when the clock signal CLK1 is at the L level, the clock signal CLK2 is at the H level.

The modulation circuit M2 is connected to an inverting input terminal of the comparator 31. Further, the modulation circuit M2 is connected to the output terminal T so that feedback voltage Vfb can be inputted. The modulation circuit M2 modulates the feedback voltage Vfb that is based on output voltage Vout based on the clock signal CLK2 with the phase negative relative to the phase of the clock signal CLK1 to generate a feedback signal Vfbm with a phase negative relative to a phase of the reference signal Vrefm, and outputs the feedback signal Vfbm to the comparator 31. The modulation circuit M2 has an identical circuit configuration with the modulation circuit M1. For example, the modulation circuit M2 is configured with an identical integration circuit with the modulation circuit M1.

The feedback signal Vfbm is configured with a triangular wave the signal level of which decreases with passage of time when the clock signal CLK2 is at the H level and increases with passage of time when the clock signal CLK2 is at the L level. Note that the feedback voltage Vfb may be partial voltage obtained by dividing the output voltage Vout by a voltage dividing circuit not shown.

That is, the reference signal Vrefm is a positive phase triangular wave, and the feedback signal Vfbm is a triangular wave with the phase negative relative to the phase of the reference signal Vrefm.

The comparator 31 is connected to a driver 41. The comparator 31 compares the reference signal Vrefm with the feedback signal Vfbm to determine duty, generates a comparator signal Vcomp having the duty and outputs the comparator signal Vcomp to the driver 41. More specifically, the comparator 31 generates the comparator signal Vcomp based on a differential input width between the reference signal Vrefm and the feedback signal Vfbm.

For example, the comparator signal Vcomp is at the H level when the feedback signal Vfbm is equal to or above the reference signal Vrefm. On the other hand, the comparator signal Vcomp is at the L level when the feedback signal Vfbm is below the reference signal Vrefm.

The driver 41 is connected to the inductor L. The driver 41 outputs a drive signal Vdr based on the comparator signal Vcomp. The driver 41 has the gate driver 42, the FET 43$p$ and the FET 43$n$.

The gate driver 42 is connected to gates of the FETs 43$p$ and 43$n$. The gate driver 42 gate-drives the FETs 43$p$ and 43$n$ by switching. The gate driver 42 causes the FET 43$p$ and the FET 43$n$ to be in an ON state and an OFF state, respectively, when the comparator signal Vcomp is at the L level. On the other hand, the gate driver 42 causes the FET 43$p$ and the FET 43$n$ to be in the OFF state and the ON state, respectively, when the comparator signal Vcomp is at the H level.

The FET 43$p$ is configured with a p-type semiconductor. In the FET 43$p$, a source is connected to the power supply voltage Vdd, and a drain is connected to the inductor L. When the gate enters the ON state, the FET 43$p$ outputs the power supply voltage Vdd to the inductor L.

The FET 43$n$ is configured with an n-type semiconductor. In the FET 43$n$, a source is connected to the ground voltage Vss, and a drain is connected to the inductor L. When the gate enters the ON state, the FET 43$n$ outputs the ground voltage Vss to the inductor L.

The drive signal Vdr is configured with the power supply voltage Vdd and the ground voltage Vss outputted by the FETs 43$p$ and 43$n$.

When switching between the FETs 43$p$ and 43$n$ is performed by the gate driver 42, noise is generated by an inductance component and a capacitance component of wiring. The noise is transmitted to the modulation circuits M1 and M2 and the comparator 31 via the power supply wiring W and superimposed on the reference signal Vrefm and the feedback signal Vfbm.

The inductor L is provided between the FETs 43$p$ and 43$n$ and the output terminal T. The capacitor C is provided between the output terminal T and the fixed potential. The inductor L and the capacitor C smooth the drive signal Vdr.

Operation

Operation of the DC-DC converter 1 will be described.

Figure 2A:
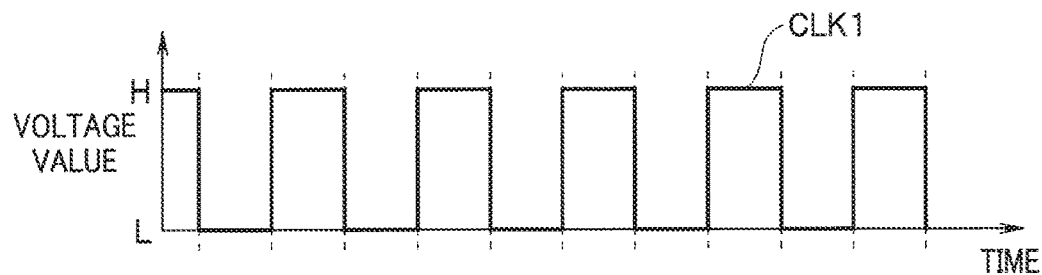
FIG. 2A is a diagram showing an example of a waveform of a clock signal of the DC-DC converter according to the embodiment.
Figure 2B:
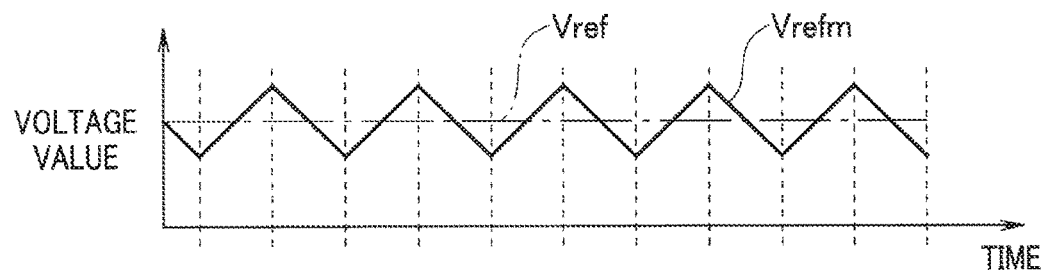
FIG. 2B is a diagram showing an example of a waveform of a reference signal of the DC-DC converter according to the embodiment.
Figure 2C:
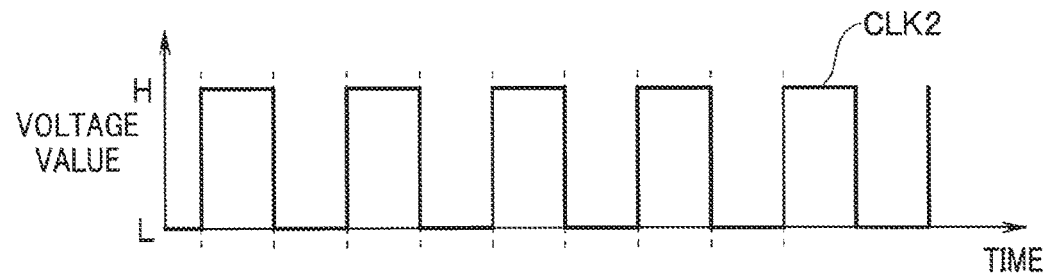
FIG. 2C is a diagram showing an example of the waveform of the clock signal of the DC-DC converter according to the embodiment.
Figure 2D:
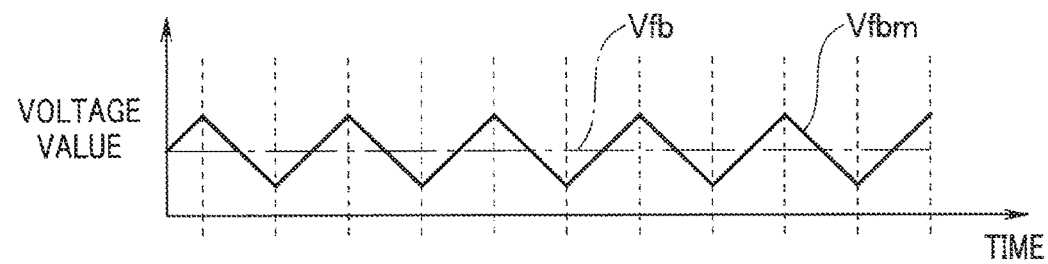
FIG. 2D is a diagram showing an example of a waveform of a feedback signal of the DC-DC converter according to the embodiment.

FIG. 2A is a diagram showing an example of a waveform of the clock signal CLK1. FIG. 2B is a diagram showing an example of a waveform of the reference signal Vrefm. FIG. 2C is a diagram showing an example of a waveform of the clock signal CLK2. FIG. 2D is a diagram showing an example of a waveform of the feedback signal Vfbm. In FIGS. 2A to 2D, a horizontal axis indicates time, and a vertical axis indicates voltage values.

The clock generating circuit 11 outputs a clock signal CLK1 in a predetermined cycle to the modulation circuit M1 and the inverter circuit 21 (FIG. 2A).

The modulation circuit M1 modulates reference voltage Vref according to the clock signal CLK1 and outputs a reference signal Vrefm to the comparator 31 (FIG. 2B).

The inverter circuit 21 inverts the clock signal CLK1 and outputs a clock signal CLK2 to the modulation circuit M2 (FIG. 2C).

The modulation circuit M2 modulates feedback voltage Vfb according to the clock signal CLK2, and outputs a feedback signal Vfbm to the comparator 31 (FIG. 2D).

The reference signal Vrefm and the feedback signal Vfbm are triangular waves in the same cycle and with phases negative relative to each other.

Figure 3A:
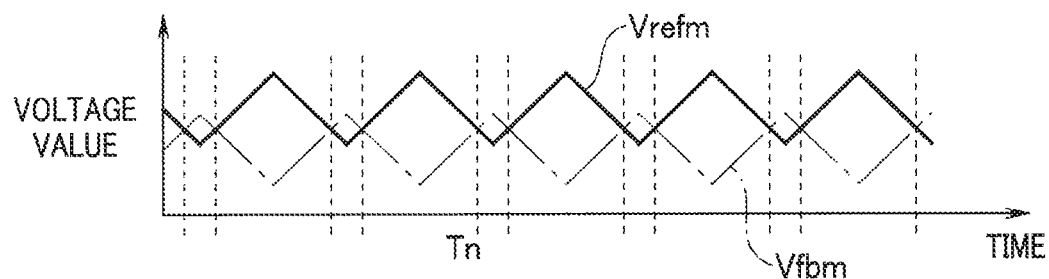
FIG. 3A is a diagram showing an example of the waveforms of the reference signal and the feedback signal of the DC-DC converter according to the embodiment.
Figure 3B:
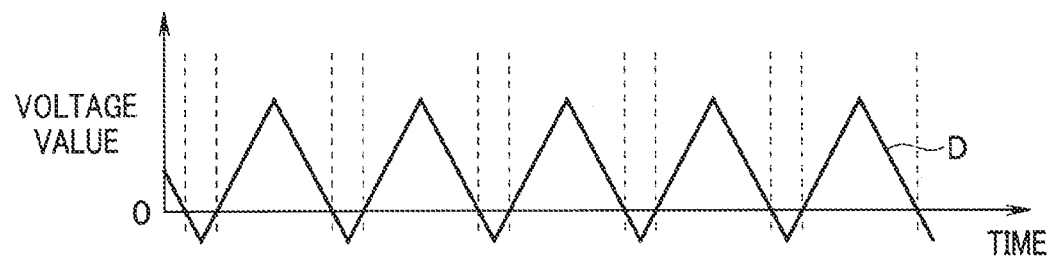
FIG. 3B is a graph showing differential signal values of the DC-DC converter according to the embodiment.
Figure 3C:
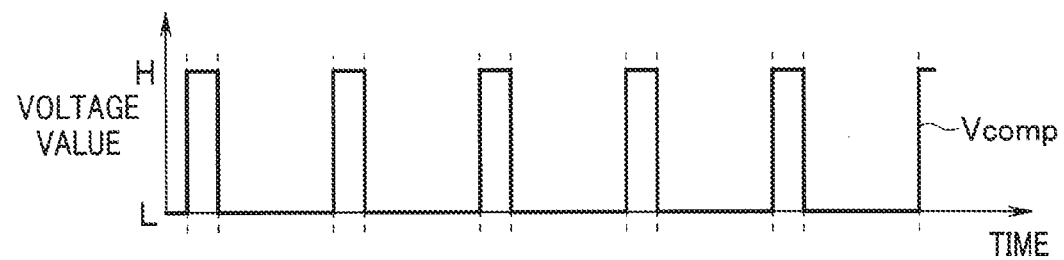
FIG. 3C is a diagram showing an example of a waveform of a comparator signal of the DC-DC converter according to the embodiment.
Figure 3D:
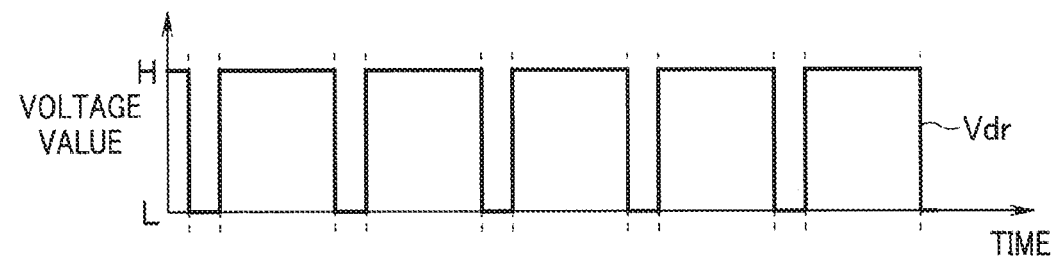
FIG. 3D is a diagram showing an example of a waveform of a drive signal of the DC-DC converter according to the embodiment.
Figure 4:
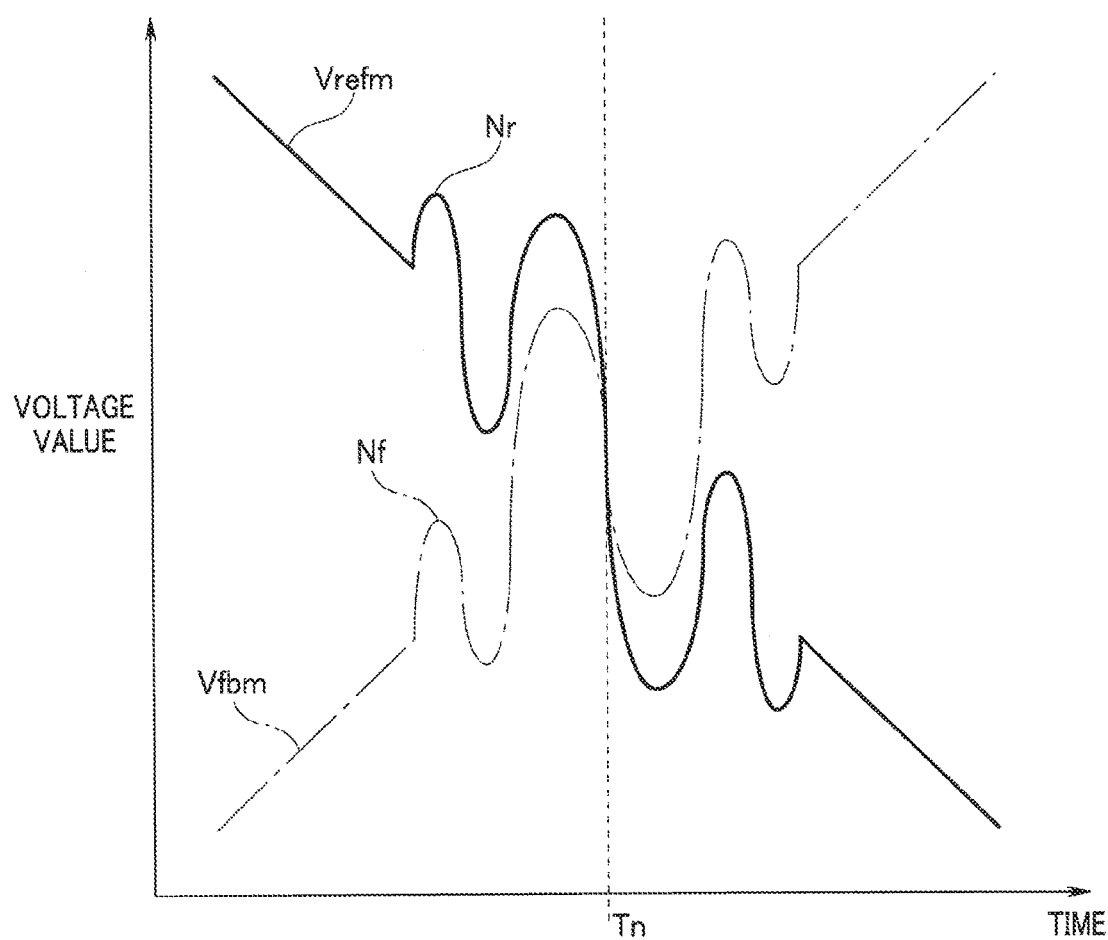
FIG. 4 is a diagram for illustrating an example of noises superimposed on the reference signal and the feedback signal of the DC-DC converter according to the embodiment.

FIG. 3A is a diagram showing an example of the waveforms of the reference signal Vrefm and the feedback signal Vfbm. FIG. 3B is a graph showing differential signal values D. FIG. 3C is a diagram showing an example of a waveform of the comparator signal Vcomp. FIG. 3D is a diagram showing an example of a waveform of the drive signal Vdr. FIG. 4 is a diagram for illustrating an example of noises Nr and Nf superimposed on the reference signal Vrefm and the feedback signal Vfbm. FIG. 4 enlargingly shows the reference signal Vrefm and the feedback signal Vfbm at time Tn in FIG. 3A.

As shown in FIG. 3A, the phases of the reference signal Vrefm and the feedback signal Vfbm are negative relative to each other and cross at the time Tn. When the feedback signal Vfbm is equal to or above the reference signal Vrefm, the comparator signal Vcomp is at the H level. When the feedback signal Vfbm is below the reference signal Vrefm, the comparator signal Vcomp is at the L level.

In other words, as shown in FIGS. 3B and 3C, the comparator signal Vcomp is at the H level when the differential signal value D, which is a difference between the feedback signal Vfbm and the reference signal Vrefm, is a negative value, and, on the other hand, the comparator signal Vcomp is at the L level when the differential signal value D is a positive value. The differential signal value D is specified by the following equation (I):

Differential signal value D=Feedback signal Vfbm−Reference signal Vrefm    (I)

When the comparator signal Vcomp reaches the L level, the FET 43$p$ is caused to be in the ON state, and the drive signal Vdr reaches the H level. On the other hand, when the comparator signal Vcomp reaches the H level, the FET 43*n* is caused to be in the ON state, and the drive signal Vdr reaches the L level.

The drive signal Vdr is smoothed by the inductor L and the capacitor C and becomes the output voltage Vout. The output voltage Vout is fed back to the modulation circuit M2 as the feedback voltage Vfb so that duty is adjusted.

When switching between the FETs 43*p* and 43*n* is performed, noise is generated. The generated noise is superimposed on the reference signal Vrefm via the modulation circuit M1 and is, further, superimposed on the feedback signal Vfbm via the modulation circuit M2. The modulation circuits M1 and M2 include mutually identical circuit configurations, and impedance of the transmission route of the noise via the modulation circuit M1 and impedance of the transmission route of the noise via the modulation circuit M2 are almost the same. As shown in FIG. 4, noise Nr is superimposed on the reference signal Vrefm, and noise Nf is superimposed on the feedback signal Vfbm. However, since the noises Nr and Nf are mutually almost in-phase, the noises Nr and Nf are offset by the comparator 31.

That is, the comparator 31 offsets the noises superimposed on the reference signal Vrefm and the feedback signal Vfbm, respectively.

Thereby, in the DC-DC converter 1, the switching noise generated by switching by the driver 41 is removed, and it is possible to suppress influence on duty given by the noise.

Further, in the DC-DC converter 1, in-phase noises generated by electromagnetic waves of an external circuit and superimposed on the reference signal Vrefm and the feedback signal Vfbm are also removed, and it is possible to suppress influence on the duty given by the noises.

Further, in the DC-DC converter 1, noise immunity is improved, and, by performing comparison with the differential signal values D, an amplitude of each of the respective reference signal Vrefm and the feedback signal Vfbm is suppressed small, and line regulation and transient responsiveness are improved.

In the above embodiment, the noise immunity is increased more in the DC-DC converter 1, and the DC-DC converter 1 can operate stably.

Note that, though the modulation circuits M1 and M2 generate a triangular wave as an example in the embodiment, the modulation circuits M1 and M2 may generate other modulated waves such as a sine wave.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first modulation circuit configured to modulate reference voltage based on a first clock signal to generate a reference signal;
   a second modulation circuit configured to modulate a feedback voltage that is based on output voltage, based on a second clock signal with a phase negative relative to a phase of the first clock signal to generate a feedback signal with a phase negative relative to a phase of the reference signal;
   a comparator configured to compare the reference signal with the feedback signal to determine duty, and generate a comparator signal having the duty; and
   a driver configured to output a drive signal based on the comparator signal.

2. The semiconductor device according to claim 1, further comprising:
   a clock generating circuit; and
   an inverter circuit, wherein
   the clock generating circuit generates the first clock signal; and
   the inverter circuit generates the second clock signal obtained by inverting the first clock signal.

3. The semiconductor device according to claim 1, wherein the first modulation circuit and the second modulation circuit include mutually identical circuit configurations.

4. The semiconductor device according to claim 1, wherein
   the reference signal is a positive phase triangular wave; and
   the feedback signal is a triangular wave with the phase negative relative to the phase of the reference signal.

5. The semiconductor device according to claim 1, wherein the first modulation circuit and the second modulation circuit are integration circuits.

6. The semiconductor device according to claim 1, wherein the comparator generates the comparator signal based on a differential input width between the reference signal and the feedback signal.

7. The semiconductor device according to claim 1, wherein the comparator offsets noises superimposed on the reference signal and the feedback signal, respectively.

8. The semiconductor device according to claim 7, wherein the noises are switching noises generated by switching by the driver.

9. A DC-DC converter comprising a semiconductor device comprising:
   a first modulation circuit configured to modulate reference voltage based on a first clock signal to generate a reference signal;
   a second modulation circuit configured to modulate a feedback voltage that is based on output voltage, based on a second clock signal with a phase negative relative to a phase of the first clock signal to generate a feedback signal with a phase negative relative to a phase of the reference signal;
   a comparator configured to compare the reference signal with the feedback signal to determine duty, and generate a comparator signal having the duty; and
   a driver configured to output a drive signal based on the comparator signal, wherein
   an inductor is provided between the driver and an output terminal configured to output the output voltage; and
   a capacitor is provided between the output terminal and fixed potential.

* * * * *